(12) United States Patent
Zhou et al.

(10) Patent No.: US 11,864,323 B2
(45) Date of Patent: *Jan. 2, 2024

(54) DRIVER BOARD ASSEMBLIES AND METHODS OF FORMING A DRIVER BOARD ASSEMBLY

(71) Applicants: Toyota Motor Engineering & Manufacturing North America, Inc., Plano, TX (US); Toyota Jidosha Kabushiki Kaisha, Toyota (JP)

(72) Inventors: Feng Zhou, Ann Arbor, MI (US); Shohei Nagai, Aichi (JP)

(73) Assignees: Toyota Motor Engineering & Manufacturing North America, Inc., Plano, TX (US); Toyota Jidosha Kabushiki Kaisha, Toyota (JP)

(*) Notice: Subject to any disclaimer, the term of this patent is extended or adjusted under 35 U.S.C. 154(b) by 581 days.

This patent is subject to a terminal disclaimer.

(21) Appl. No.: 16/929,686

(22) Filed: Jul. 15, 2020

(65) Prior Publication Data

US 2022/0022323 A1    Jan. 20, 2022

(51) Int. Cl.
  *H05K 1/18* (2006.01)
  *H05K 7/20* (2006.01)
  (Continued)

(52) U.S. Cl.
  CPC .......... *H05K 1/188* (2013.01); *H05K 1/0207* (2013.01); *H05K 1/0209* (2013.01); *H05K 1/185* (2013.01); *H05K 3/30* (2013.01); *H05K 7/20509* (2013.01)

(58) Field of Classification Search
  None
  See application file for complete search history.

(56) References Cited

U.S. PATENT DOCUMENTS 6,580,611 B1 * 6/2003 Vandentop ............ H01L 23/367
                                                      257/713
10,591,964 B1   3/2020 Mikjaniec et al.
(Continued)

FOREIGN PATENT DOCUMENTS

CN    202076924 U    12/2011
EP    0590354 A1    4/1994
(Continued)

OTHER PUBLICATIONS

Kearney et al. ("PCB Embedded Power Electronics for Low Voltage Applications," CIPS 2016) (Year: 2016).*
(Continued)

*Primary Examiner* — Hoa C Nguyen
*Assistant Examiner* — John B Freal
(74) *Attorney, Agent, or Firm* — Dinsmore & Shohl LLP

(57) ABSTRACT

A driver board assembly includes a printed circuit board (PCB) substrate, one or more power devices embedded within the PCB substrate, and a plurality of conductive layers arranged within the PCB substrate. The plurality of conductive layers are configured to electrically couple the one or more power devices to a current source and thermally couple the one or more power devices to one or more cooling assemblies mounted to at least one of a first surface of the PCB substrate and a second surface of the PCB substrate opposite the first surface of the PCB substrate.

20 Claims, 11 Drawing Sheets

(51) Int. Cl.
*H05K 1/02* (2006.01)
*H05K 3/30* (2006.01)

(56) References Cited

U.S. PATENT DOCUMENTS

| | | | |
|---|---|---|---|
| 10,912,232 B2* | 2/2021 | Nakajima | H02M 7/003 |
| 2003/0174037 A1* | 9/2003 | Hooey | H02M 7/003 |
| | | | 336/61 |
| 2007/0230132 A1 | 10/2007 | Lee | |
| 2013/0229209 A1 | 9/2013 | Miyauchi et al. | |
| 2019/0221521 A1 | 7/2019 | Hohlfield et al. | |

FOREIGN PATENT DOCUMENTS

| | | | |
|---|---|---|---|
| JP | H04180660 A | 6/1992 | |
| JP | H08307077 A | 11/1996 | |

OTHER PUBLICATIONS

Charboneau et al. ("Double-Sided Liquid Cooling for Power Semiconductor Devices Using Embedded Power Packaging," Transactions on Industry Applications 2008) (Year: 2008).*

Röhrich et al., "Chip Embedding of Power Semiconductors in Power Circuit Boards," ATZ elektronik worldwide, Jun. 2018, 56-59.

* cited by examiner

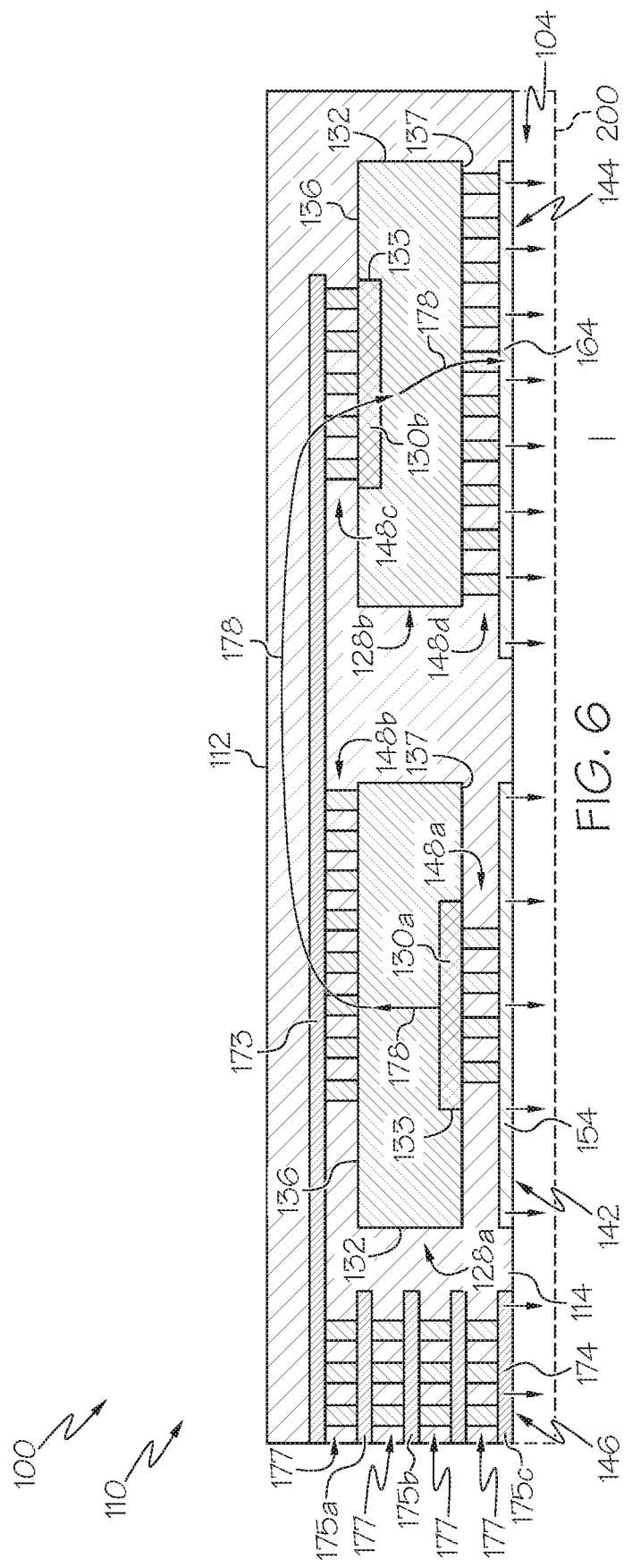

DRIVER BOARD ASSEMBLIES AND METHODS OF FORMING A DRIVER BOARD ASSEMBLY

TECHNICAL FIELD

The present specification generally relates to driver board assemblies and methods of forming a driver board assembly and, more specifically, driver board assemblies and methods of forming a driver board assembly including power devices embedded within a PCB substrate and providing integrated thermal paths for directing heat to one or more cooling assemblies mounted to the PCB substrate.

BACKGROUND

A power control unit (PCU) may be used in motor-drive hybrid and electric vehicles. PCUs may include power devices arranged in inverter and/or converter topologies, which are packaged in a plurality of power cartridges which may be individually connected to a driver board. The power cartridges may be sandwiched in a liquid cooler to maintain a particular temperature while the power devices are switched on/off, which generates heat. The power cartridges are mounted to the driver board via pins and may extend a distance from the driver board, leading to a larger volume profile. As designs are reduced to smaller, compact footprints, is may be desirable to develop power drive assemblies having smaller volume profiles while still providing desired cooling.

SUMMARY

Embodiments of the present disclosure are directed to embedding power devices directly within a PCB substrate and providing integrated cooling assemblies, which may decrease a volume profile of the driver board assembly, thereby providing more compact driver board assemblies and increased power density.

In one aspect, a driver board assembly includes a printed circuit board (PCB) substrate, one or more power devices embedded within the PCB substrate, and a plurality of conductive layers arranged within the PCB substrate. The plurality of conductive layers are configured to electrically couple the one or more power devices to a current source and thermally couple the one or more power devices to one or more cooling assemblies mounted to at least one of a first surface of the PCB substrate and a second surface of the PCB substrate opposite the first surface of the PCB substrate.

In another aspect, a driver board assembly includes a PCB substrate, one or more power device assemblies, and a plurality of conductive layers arranged within the PCB substrate and configured to electrically couple the one or more power device assemblies to one or more cooling assemblies mounted to at least one of a first surface of the PCB substrate and a second surface of the PCB substrate. The one or more power device assemblies include a conductive substrate, and a power device embedded within the conductive substrate. The one or more power device assemblies are embedded within the PCB substrate.

In yet another aspect, a method of forming a power device assembly includes arranging one or more power devices within a PCB substrate, and arranging a plurality of conductive layers within the PCB substrate. The plurality of conductive layers are configured to electrically couple the one or more power devices to a current source and thermally couple the one or more power devices to one or more cooling assemblies mounted to at least one of a first surface of the PCB substrate and a second surface of the PCB substrate opposite the first surface of the PCB substrate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 6 schematically illustrates a cross section of a driver board assembly having a first power device assembly facing a first direction and a second power device assembly facing a second direction opposite the first direction, according to one or more embodiments shown and described herein;

DETAILED DESCRIPTION

Figure 1:
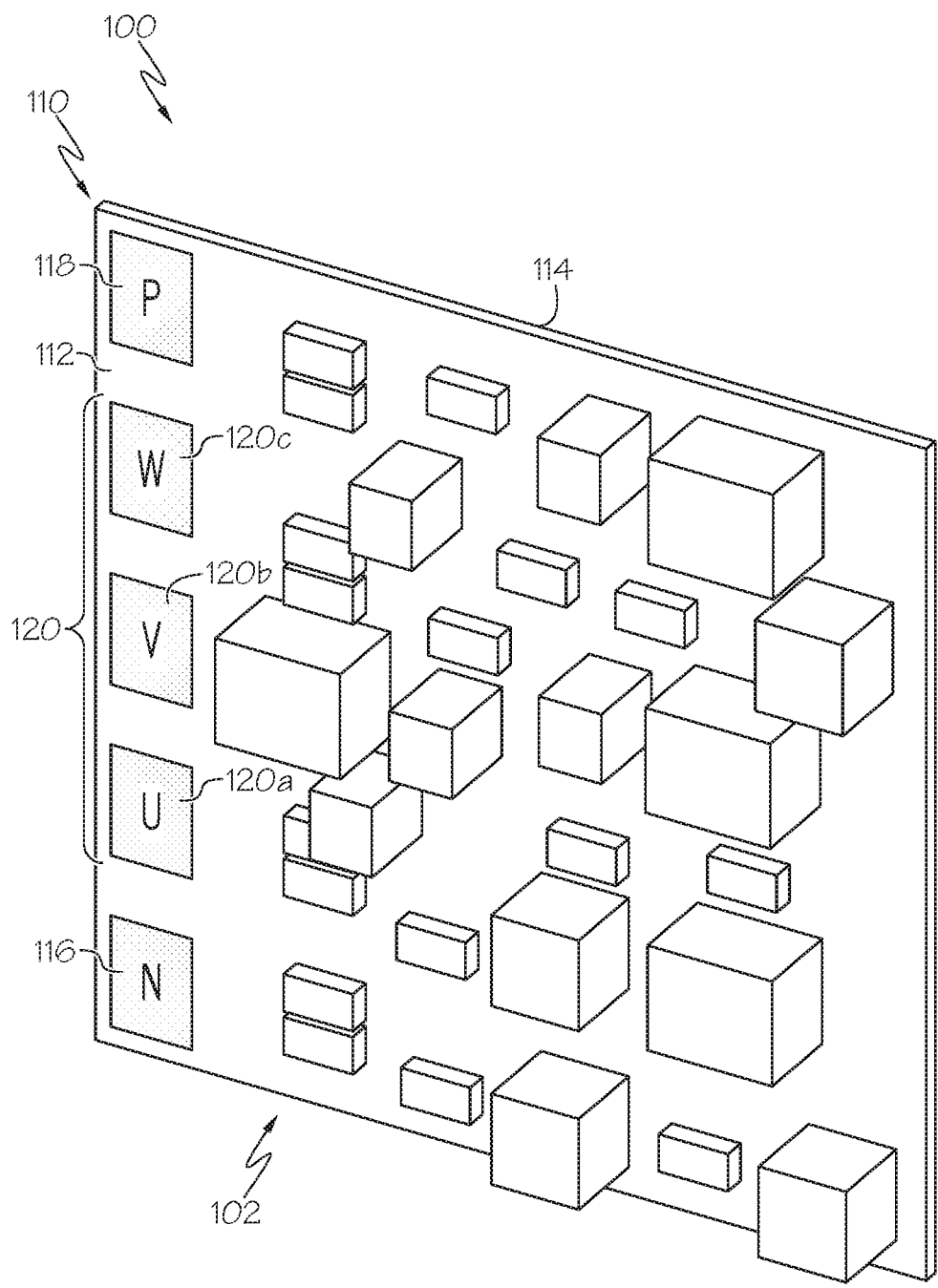
FIG. 1 schematically depicts a driver board assembly, according to one or more embodiments shown and described herein.

Embodiments of the present disclosure are directed to driver board assemblies and methods of forming a driver board assembly. In the embodiments described herein driver board assemblies include a PCB (Printed Circuit Board) substrate. The PCB substrate may include one or more embedded power devices and a plurality of conductive layers that together provide both electrical conduction and thermal conduction. In particular, the plurality of conductive layers provide thermal paths for directing heat to one or more cooling assemblies, which may be mounted to the PCB substrate. By integrating the one or more power devices into a body of the PCB substrate, a more compact, power dense driver board may be achieved. Embodiments as provided herein provide numerous advantages including smaller volume profiles, lighter system weights, high system power density, lower overall inductance (e.g., so that smaller switching loss is achieved, especially at high switching frequencies), lower cost, or the like. Moreover, embodiments of the present disclosure are able to operate under high power (e.g., 40+KW) environments, thereby providing greater range of uses. Various embodiments of driver board assembly and methods of manufacture will be described in more detail herein.

Conventional motor drive systems in electrified vehicles (e.g., hybrid electrical vehicles, plug-in hybrid electric vehicles, fuel cell vehicle, and electric vehicles) may include a motor and a power control unit (PCU) that supplies current to the motor from a current source (e.g., a battery). Accordingly, the PCU may include any number of components and/or modules that may allow the PCU to control current supplied to the motor (or other vehicle electronic). In particular, the PCU may include a driver board assembly. However, and as noted above, conventional PCUs may include power devices which are packaged in power cartridges which may be connected to a driver board. The power cartridges may be sandwiched in a liquid cooler to maintain a particular temperature while the power devices are switched on/off, which generates heat. These cartridges and cooling assemblies may have larger volume profiles and/or result in increased electrical inductance.

Embodiments of the present disclosure are directed to assemblies providing lower volume profiles and/or reduced electrical inductance. Moreover, embodiments of the present disclosure allow for operation of high power devices (for example, greater than or equal to 40 kW, 50 kW, 60 kW, 70 kW, 80 kW, 90 kW, 100 kW, 110 kW, 120 kW, 130 kW, 140 kW, or 150 kW) that operate under high temperatures (for example, in excess of 100° C., 150° C., 175° C., 200° C., 225° C., or 250° C.), which generate a large amount of heat that must be removed for the continued operation of the PCU. In particular, the embedded cooling pathways, as will be described in greater detail below, allow for efficient conduction of heat from one or more power devices to prevent overheating, damage, or the like.

Referring now to FIG. 1, an embodiment of a driver board assembly 100 providing a lower volume profile, increased power density, and lower electrical inductance is generally depicted. The driver board assembly 100 may generally include a PCB substrate 110 comprising a first surface 112 and a second surface 114 opposite and parallel to the first surface 112. Mounted to the first and/or second surface 112, 114 of the PCB substrate 110 may be a one or more of passive components and/or electrical components 102, such as logic circuits, which allow the driver board assembly 100 to function as a gate driver, for example. The one or more passive components and/or electrical components 102 may include one or more resistors, capacitors, inductors, diodes, oscillators, transistors, integrated circuits, switches, terminals, or the like. The first surface 112 or the second surface 114 may also include one or more terminals for connection to one or more devices as will be described in greater detail herein.

For example, the one or more terminals may include a plurality of power terminals including a N-terminal 116, one or more O-terminals 120 (e.g., U-terminal 120a, V-terminal 120b, and W-terminal 120c), and a P-terminal 118 configured electrically couple the driver board assembly 100 to one or more devices (not shown). As will be described below, the driver board assembly 100 may be operable to convert a type of current from a first current to a second current (e.g., AC to DC, DC to AC, or the like). In some embodiments, it is contemplated that the driver board assembly 100 may instead be arranged to convert a first voltage to a second voltage. Accordingly, the driver board assembly 100 may be arranged in a converter topology, an inverter topology, or the like.

Figure 2:
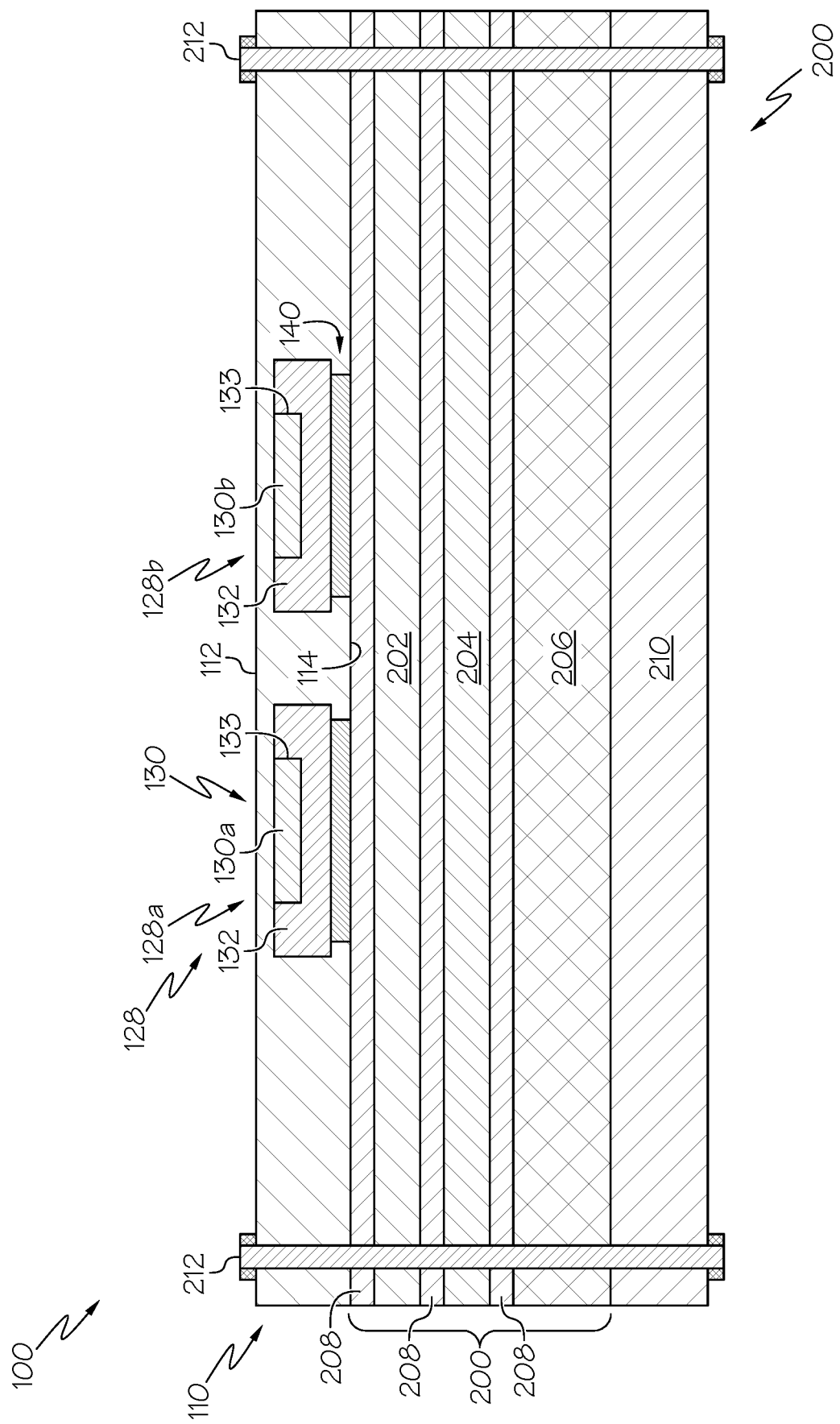
FIG. 2 schematically depicts a cooling assembly mounted to a PCB substrate of the driver board assembly of FIG. 1, according to one or more embodiments shown and described herein.

FIG. 2 schematically illustrates a cross-section of the PCB substrate 110 mounted to the cooling assembly 200 without the plurality of passive components and/or electrical components 102, illustrated in FIG. 1. As illustrated in FIG. 2, one or more cooling assemblies 200 may be mounted to at least one of the first surface 112 of the PCB substrate 110 and a second surface 114 of the PCB substrate 110, opposite the first surface 112 of the PCB substrate 110. As will be described in greater detail herein and as schematically illustrated in FIG. 2, a plurality of conductive layers 140 arranged within the PCB substrate 110 thermally couples one or more power devices 130 embedded within the PCB substrate 110 to the one or more cooling assemblies 200, such that the one or more cooling assemblies 200 may provide cooling to the one or more power devices 130 by drawing heat away from the one or more power devices 130.

The one or more cooling assemblies 200 may include any device or combination of devices that remove heat generated by the one or more power devices 130. In some embodiments, the one or more cooling assemblies 200 may include an electrical insulation layer 202, a heat spreader layer 204, and a cold plate 206. It is noted that the one or more cooling assemblies 200 may include a greater or fewer number of components without departing from the scope of the present disclosure. In embodiments, one or more grease layers 208 (e.g., thermal grease layers 208) may interface between each layer of the one or more cooling assemblies 200 and/or between the PCB substrate 110 and the one or more cooling assemblies 200 to reduce thermal resistance and/or increase thermal conductivity by eliminating thermally insulating air pockets which may otherwise form between the PCB substrate 110 and the various layers of the one or more cooling assemblies 200. In some embodiments, the one or more grease layers 208 may be electrically insulating to electrically isolate the PCB substrate 110 from the cooling assembly 200 and may in some embodiments form the electrical insulation layer 202. The one or more grease layers 208 may include, for example, epoxies, silicones, urethanes, acrylates, metals, metal-alloys, or any combination thereof.

As noted above, the PCB substrate 110 may include a plurality of conductive layers 140 that provide both electrical and thermal conduction through the PCB substrate 110. Accordingly, an electrical insulation layer 202 may be disposed between the PCB substrate 110 and the heat spreader layer 204 and/or the cold plate 206 to electrically isolate electricity from one or more components of the one or more cooling assemblies 200 (e.g., the heat spreader layer 204 and/or the cold plate 206). The electrical insulation layer 202 may include any electrically insulating, thermally conductive material (e.g., beryllium oxide, aluminum nitride, or the like) or combination of materials. The electrical insulation layer 202 may be in contact with the PCB substrate 110 through a grease layer 208 to ensure contact. In some embodiments, the electrical insulation layer 202 may be provided via a grease layer 208 such as described above.

A heat spreader layer 204 may be mounted between the electrical insulation layer 202 and the cold plate 206. A heat spreader layer 204 may also be referred to as a vapor chamber or heat pipe (such as may be used in high power assemblies (e.g., 40+KW), and may be configured to spread heat generated by the plurality of power devices 130 within the PCB substrate 110 over a larger area to improve cooling. A grease layer 208 may be arranged between the heat spreader layer 204 and the electrical insulation layer 202 to provide improved contact between the heat spreader layer 204 and the electrical insulation layer 202. In some embodiments, the one or more cooling assemblies 200 may not include a heat spreader layer 204, such as in lower power assemblies (e.g., less than about 40 KW, such as about 5 KW to about 10 KW).

The cold plate 206 may be mounted to one of the electrical insulation layer 202 and, if present, the heat spreader layer 204 opposite the electrical insulation layer 202 to thermally couple the cold plate 206 the plurality of conductive layers 140. The cold plate 206 may be coupled to the one of the electrical insulation layer 202 and the heat spreader layer 204 via a grease layer 208 to improve contact between the cold plate 206 and the one of the electrical insulation layer 202 and the heat spreader layer 204. The cold plate 206 may draw heat through the cooling assembly 200 from the one or more power devices 130 along the plurality of conductive layers 140. The cold plate 206 may include one or more channels formed therein which allow for coolant fluid to be circulated through the cold plate 206 to draw heat away from the cold plate 206. In some embodiments, a cold plate 206 may include a plurality of fins past which coolant fluid may flow to draw heat from the cold plate 206.

The one or more cooling assemblies 200 may be fixed to the PCB substrate 110 via a plurality of fasteners 212 (e.g., bolts) extending through each of the layers of the one or more cooling assemblies 200 and the PCB substrate 110. However, other coupling techniques are contemplated and possible. For example, an external housing or cage (not shown) may mount the one or more cooling assemblies 200 to the PCB substrate 110.

In some embodiments, another electronic device, such as a capacitor 210 for storing electrical energy may be mounted to the one or more cooling assemblies 200 opposite the PCB substrate 110. The operation of the capacitor 210 may also generate heat. Accordingly, the cold plate 206 may be in thermal communication with the capacitor 210 (e.g., mounted to the capacitor 210) such that the one or more cooling assemblies 200 may cool the capacitor 210 as it simultaneously cools the one or more power devices 130. The capacitor 210 may be mounted to the one or more cooling assemblies 200 via the plurality of fasteners 212, such that the plurality of fasteners 212 extend through each of the layers of the one or more cooling assemblies 200, the PCB substrate 110, and the capacitor 210. However, and as noted above, other coupling techniques are also contemplated and possible. For example, an external housing or cage (not shown) may mount the capacitor 210 to the one or more cooling assemblies 200 and the PCB substrate 110. In some embodiments, there may not be a capacitor 210 mounted to the one or more cooling assemblies 200.

The thermal and/or electrical architecture within the PCB substrate 110 will now be described in greater detail. Generally, PCB substrates are formed from one or more layers of conductive material (e.g., copper, aluminum, silver, nickel, any combination thereof, or the like) etched to form various conductive pathways laminated onto and/or between sheets/layers of non-conductive substrates (e.g., dielectric polymer layers) to form an integral and uniformly thick PCB substrate 110. PCB substrates according to the present disclosure include a plurality of layers laminated together around the one or more power devices 130 such that the one or more power devices 130 are completely encased within the PCB substrate 110 (such as illustrated in FIG. 2). The plurality of conductive layers 140, as noted above, provide both electrical conduction to and from the one or more power devices 130 and thermal conductive between the one or more power devices 130 and the one or more cooling assemblies 200.

Figure 3:
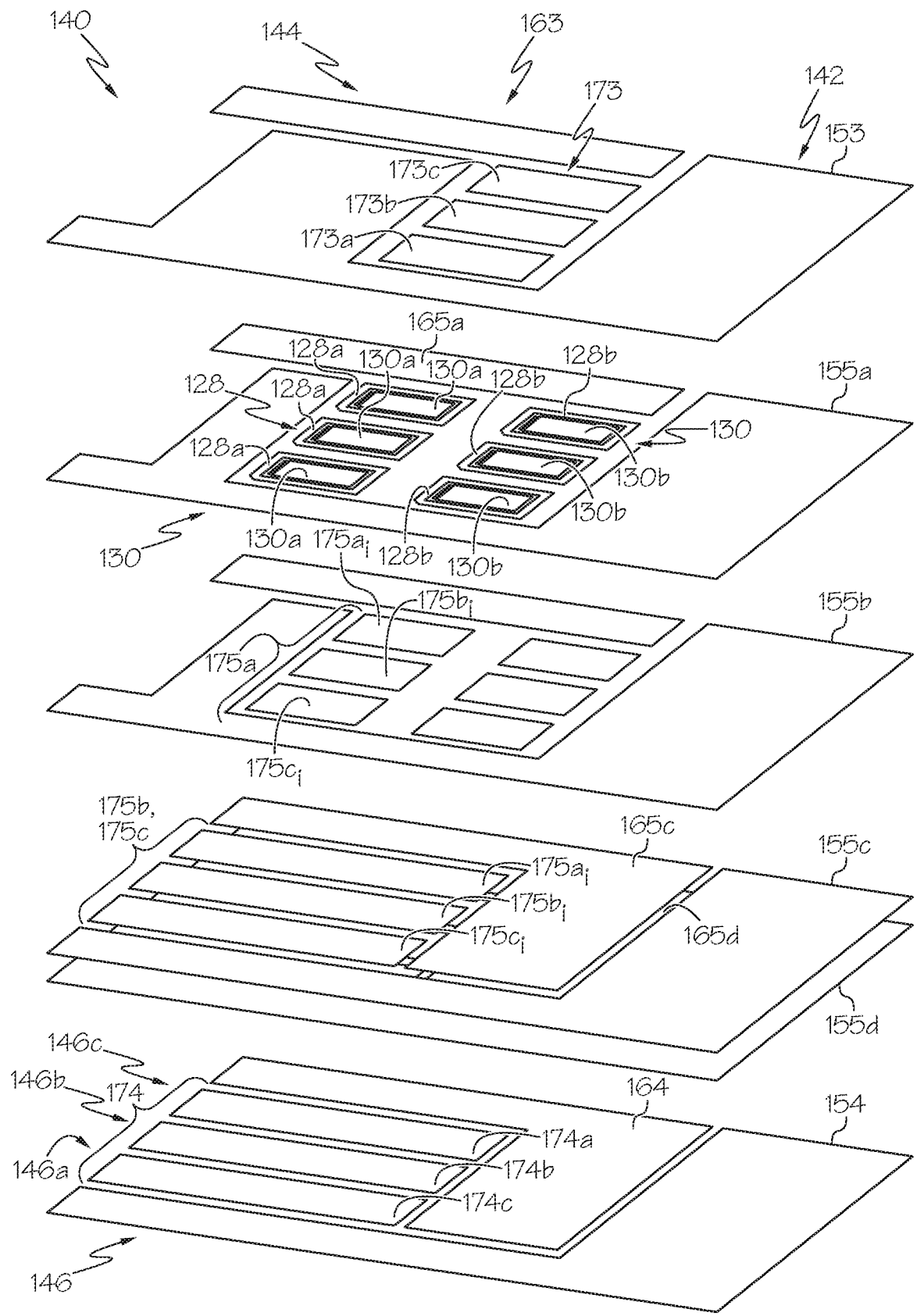
FIG. 3 schematically depicts an exploded view of a plurality of conductive layers embedded within a PCB substrate such as depicted in FIG. 1, according to one or more embodiments shown and described herein.

FIG. 3 schematically illustrates an exploded view of various conductive layers of the PCB substrate 110 without depicting any isolating dielectric material Additionally, though not illustrated, one or more conductive layers of the PCB substrate 110 may include one or more logic layers (e.g., two or more logic layers) at one or more of the first surface 112 and the second surface 114 of the PCB substrate 110. The one or more logic layers may include any number of ports and/or electric traces for coupling the plurality of passives and/or electrical components 102, illustrated in FIG. 1, to the one or more power devices 130 and/or to one another.

The plurality of conductive layers 140 (e.g., two or more layers, three or more layers, four or more layers, five or more layers, six or more layers, seven or more layers, eight or more layers, etc.) are configured to provide electrical and thermal conduction, as described in further detail below. It is noted that the layout of each layer illustrated is non-limiting as the layer architecture may be modified in a variety of ways, such as described herein, to, for example, provide one of the inverter topology and the converter topology.

Figure 5A:
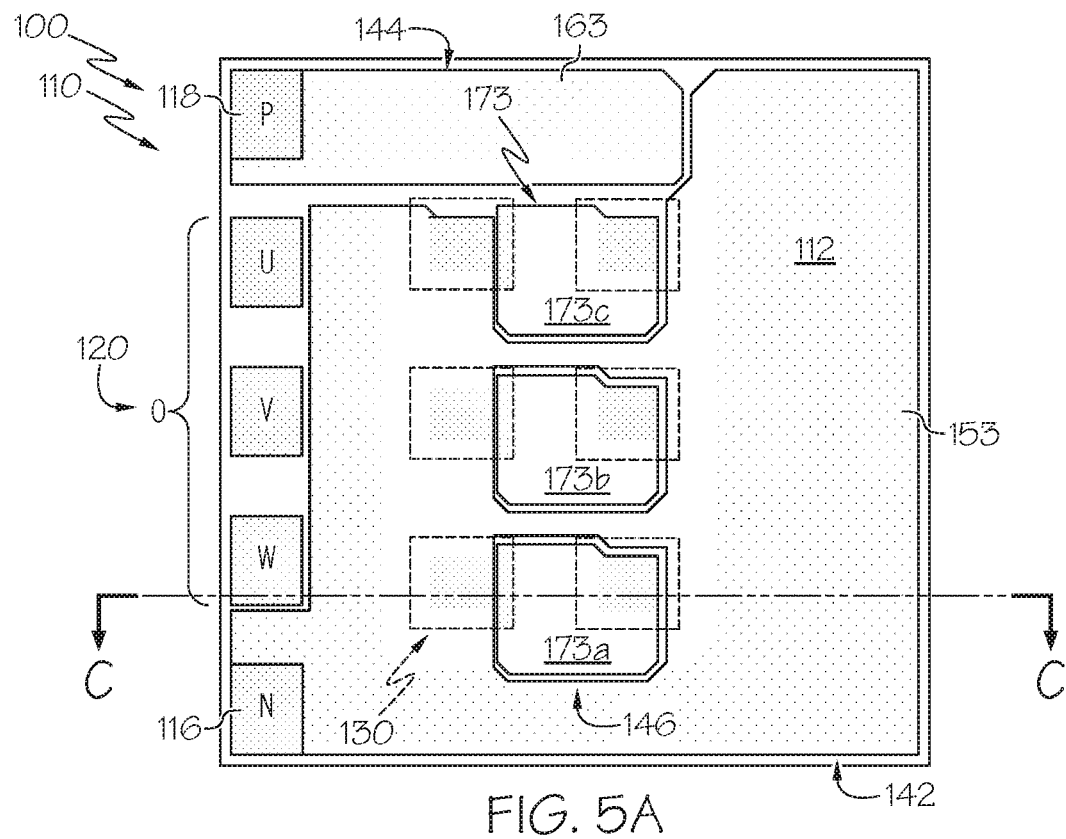
FIG. 5A schematically depicts a first or front surface of a PCB substrate of a driver board assembly, according to one or more embodiments shown and described herein.

For example, the plurality of conductive layers 140 may provide one or more electrical and thermal conduction architectures. For example the plurality of conductive layers 140 may provide a first conductive layer architecture including a plurality of layers, a second conductive layer architecture including a plurality of layers, a third conductive layer architecture including a plurality of layers, or the like. For example, the plurality of conductive layers 140 may define an N-conductive layer architecture 142, an O-conductive layer architecture 146, and a P-conductive layer architecture 144, which electrically couples the one or more power devices 130 to the N-terminal 116, the one or more O-terminals 120, and the P-terminal 118, respectively, as illustrated in FIG. 5A. The N-conductive layer architecture 142, O-conductive layer architecture 146, and P-conductive layer architecture 144 refer to electrical circuit architecture such as in an inverter or converter topology. For example, the N-conductive layer architecture 142 may electrically couple the one or more power devices 130 to a current source (for example, a battery), the O-conductive layer architecture may output an inverted or converted current signal (e.g., AC instead of DC), and the P-conductive layer architecture may complete the circuit may coupling the one or more power devices 130 back to the current source.

As noted herein and further described below, the N-conductive layer architecture 142, the O-conductive layer architecture 146, and the P-conductive layer architecture 144 also provide thermal management to the one or more power devices 130 by providing thermally conductive pathways to deliver heat generated by operation (e.g., switching on/off) of the one or more power devices 130 to the cooling assembly 200 thereby cooling to one or more power devices 130. It is noted, for clarity, that each of the N-conductive layer architecture 142, O-conductive layer architecture 146, and P-conductive layer architecture 144 are separate and distinct from one another to allow for operation of the driver board assembly 100 in the one of the converter and/or inverter topology.

Still referring to FIG. 3, the N-conductive layer architecture 142 may include a plurality of electrically and thermally conductive N-layers including a top N-layer 153, a bottom N-layer 154, and a plurality of intermediate N-layers (e.g., 155a, 155b, 155c, 155d, etc.). There may be any number of intermediate N-layers between the top N-layer 153 and the bottom N-layer 154 (e.g., one or more N-layers, two or more N-layers, three or more N-layers, four or more N-layers, etc.) When laminated together in the PCB substrate 110, each of the N-layers may be electrically and thermally coupled to one another. For example, and with reference to FIG. 5C, the plurality of N-layers may be in contact with another (e.g., either directly contacted such as in a face to face relationship with one another or in contact through a plurality of conductive vias 147 such as, but not limited to, copper vias, aluminum vias, or the like) extending between each N-layer. In some embodiments, each layer of the plurality of conductive layers 140 may include an N-layer. In some embodiments, only some of the conductive layers 140 may include an N-layer. The N-conductive layer architecture 142 is connected to and/or defines the N-terminal 116 as noted above.

Referring again to FIG. 3, the P-conductive layer architecture 144 may include a plurality of P-layers including a top P-layer 163, a bottom P-layer 164, and a plurality of intermediate P-layers (e.g., P-layer 165a, 165b, 165c, 165d, etc.). There may be any number of intermediate P-layers between the top P-layer 163 and the bottom P-layer 164 (e.g., one or more P-layers, two or more P-layers, three or more P-layers, four or more P-layers, etc.). When laminated together in the PCB substrate 110, each of the P-layers may be electrically and thermally coupled to one another. For example, and with reference to FIG. 7, the plurality of P-layers may be in contact with another (e.g., either directly contacted with one another or in contact through a plurality of conductive vias 167 such as, but not limited to, copper vias, aluminum vias, or the like). In some embodiments, each layer of the plurality of conductive layers 140 may include a P-layer. In some embodiments, only some of the conductive layers 140 may include an P-layer. The P-conductive layer architecture 144 is connected to and/or defines the P-terminal 118 as noted above.

Referring again to FIG. 3, the O-conductive layer architecture 146 may include a plurality of O-layers including one or more top O-layers 173, one or more bottom O-layers 174, and a plurality of intermediate O-layers (e.g., intermediate O-layer 175a, 175b, 175c, etc.). There may be any number of intermediate O-layers between the one or more top O-layers 173 and the one or more bottom O-layers 174. (e.g., one or more O-layers, two or more O-layers, four or more O-layers, etc.).

When arranged in an inverter topology, the O-conductive layer architecture 146 may include U-conductive layer architecture 146a, a V-conductive layer architecture 146b, and a W-conductive layer architecture 146c. For example, the U-conductive layer architecture 146a, the V-conductive layer architecture 146b, and the V-conductive layer architecture 146c may be configured to output one of each phase of an alternating current (i.e., the U-phase, V-phase, and W-phase) to provide an alternating current to, for example, an electric motor. As illustrated the U-conductive layer architecture 146a, V-conductive layer architecture 146b, and W-conductive layer architecture 146c may be substantially identical to one another and positioned parallel to one another.

The one or more top O-layers 173 may include a top U-layer 173a, a top V-layer 173b, and a top W-layer 173c. Similarly, the one or more bottom O-layers 174 include a bottom U-layer 174a, a bottom V-layer 174b, and a bottom W-layer 174c. Additionally, each of the plurality of intermediate O-layers includes an intermediate U-layer $175a_i$, an intermediate V-layer $175b_i$, and an intermediate W-layer $175c_i$. Each of the intermediate U-layer $175a_i$, intermediate V-layer $175b_i$, and intermediate W-layer $175c_i$ may include any number of layers (e.g., one or more layers, two or more layers, three or more layers, four or more layers, etc.) When laminated together in the PCB substrate 110, each of the U-layers may be electrically and thermally coupled to one another, each of the V-layers may be electrically and thermally coupled to one another, and each of the W-layers may be electrically and thermally coupled to one another. For example, and with reference to FIG. 6, each layer of the O-conductive layer architecture 146 (i.e., each layer of the U-conductive layer architecture 146a, each layer of the V-conductive layer architecture 146b, and each layer of the W-conductive layer architecture 146c) may by in contact with one another (e.g., either directly contacted with one another or in contact through a plurality of conductive vias 177 such as, but not limited to, copper vias, aluminum vias, or the like). In some embodiments, each layer of the plurality of conductive layers 140 may include an O-layer. In some embodiments, only some of the conductive layers 140 may include an O-layer. The O-conductive layer architecture 146 is connected to and/or defines the one or more O-terminals 120. For example, the one or more O-terminals 120 may include a U-terminal 120a (defined by and/or connected to the U-conductive layer architecture 146a), a V-terminal 120b (defined by and/or connected to the V-conductive layer architecture 146b), and a W-terminal 120c (defined by and/or connected to the W-conductive layer architecture 146c. Additionally, each of the U-conductive layer architecture 146a, V-conductive layer architecture 146b, and W-conductive layer architecture 146c are separate and distinct from one another to allow alternating current to be delivered via the U-conductive layer architecture 146a, V-conductive layer architecture 146b, and W-conductive layer architecture 146c to the corresponding U-terminal 120a, the V-terminal 120b, and the W-terminal 120c).

Still referring to FIG. 3, the one or more power devices 130 may be positioned within one or more of the intermediate layers (e.g., the second layer in the illustrated embodiment). The upper layers (e.g., the first through the third layers) may provide the topology of an inverter, converter, or the like. The lower layers (e.g., the fourth through six-layer) may provide the additional conductive layers to conduct heat away from the one or more power devices 130 to the second surface 114 of the PCB substrate 110 and may include similar footprint areas for each of the N-conductive layer architecture 142, O-conductive layer architecture 146, and P-conductive layer architecture 144 to encourage heat transfer toward the second surface 114 of the PCB substrate 110. However, other configurations are contemplated and possible such as where double side cooling is desired.

Figure 4A:
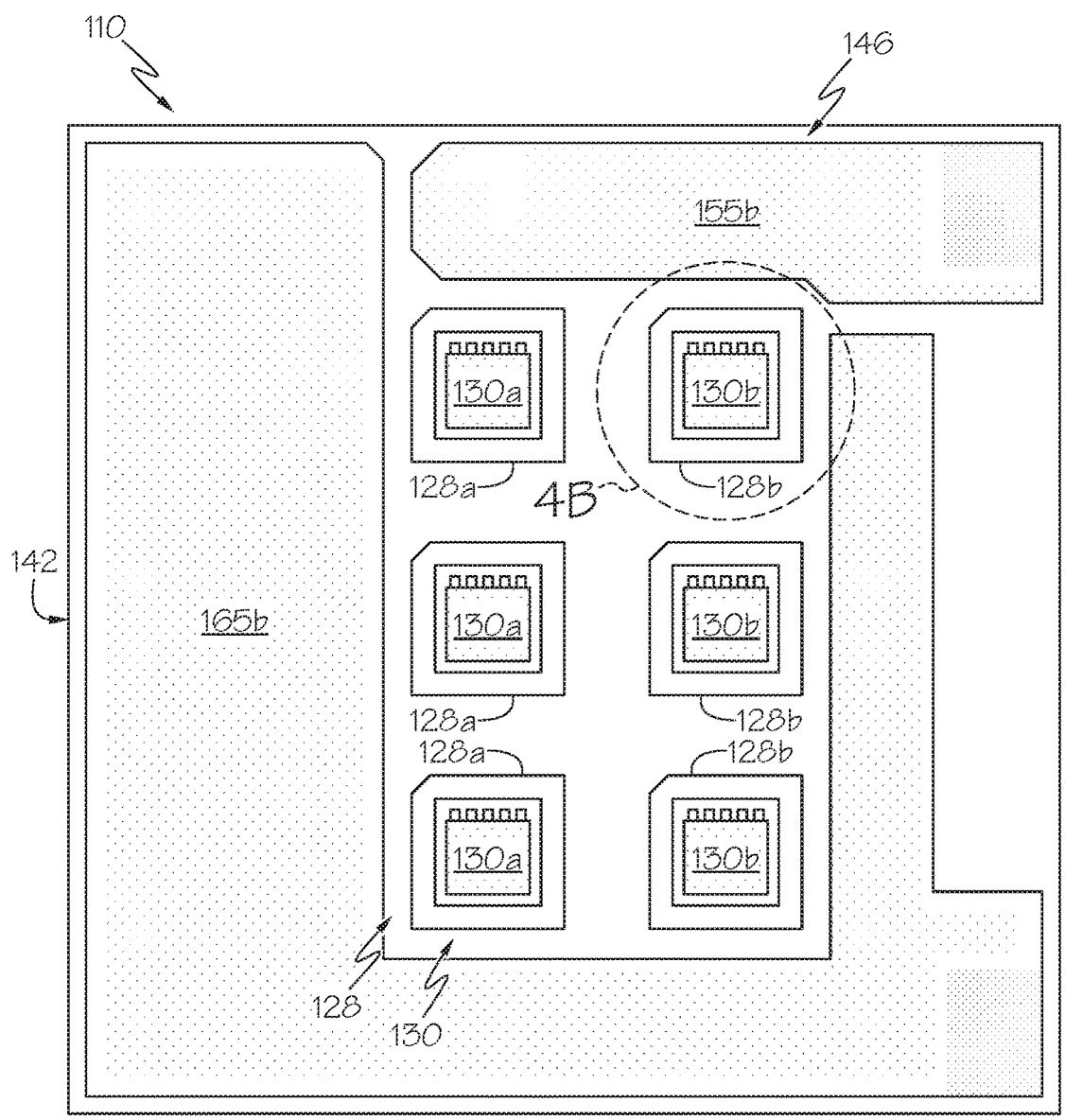
FIG. 4A schematically depicts a plurality of power device assemblies mounted within the PCB substrate of FIG. 3, according to one or more embodiments shown and described herein.

FIG. 4A schematically depicts an intermediate layer of the PCB substrate 110 such that the top conductive layer including the top N-layer 153, top O-layers 173 (i.e., the top U-layer 173a, the top V-layer 173b, and the top W-layer 173c), and the top P-layer are removed to reveal an intermediate conductive layer and the one or more power devices 130 embedded within the PCB substrate 110. The one or more power devices 130 may include a plurality of power devices, which may be arranged in pairs of two power devices including a first power device 130a and a second power device 130b. As will be described herein, the one or more power devices 130 may include switching devices which may be operated in such a manner as to convert a direct current to an alternating current. However, it is contemplated that assemblies as described herein may be assembled in a converter topology to convert an alternating current to a direct current, of perform some other conversion from a first current type to a second current type. It is noted that the following-description generally focuses inverter topologies though other topologies are contemplated and possible.

The one or more power devices 130 may include one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the one or more power devices 130 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the one or more power devices 130 operate at high current and under high temperatures, for example in excess of 250° C. and generate a large amount of heat that must be removed for the continued operation of the example driver board assembly 100. The one or more power devices 130 may be controlled by the gate drive device (not shown) in the PCB substrate 110 to change a current type between an alternating current to a direct current, for example.

Figure 4B:
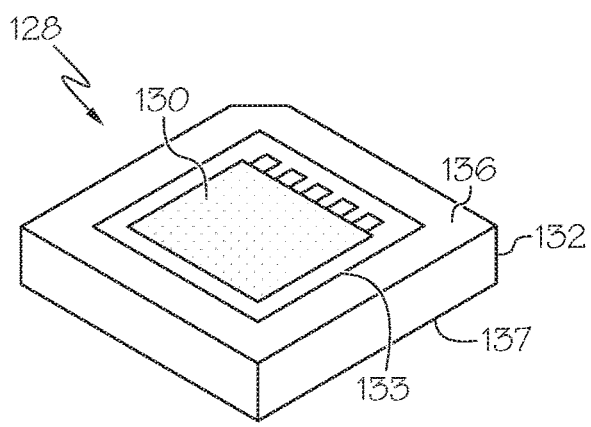
FIG. 4B schematically depicts a perspective view of a power device assembly of FIG. 4A, according to one or more embodiments shown and described herein.

Each of the power devices 130 may be part of a power device assembly 128 such that embedded within the PCB substrate 110 are one or more power device assemblies 128 each comprising a conductive substrate 132 and a power device 130 embedded within the conductive substrate 132 (e.g., formed from copper, aluminum, zinc, or the like). For example, and as illustrated in FIG. 4B, a cavity 133 may be formed within the conductive substrate 132 and the power device 130 may be positioned within the cavity 133 and bonded to the conductive substrate 132 (e.g., any conventional bonding techniques such as sintering, soldering, or the like may be used). The one or more power device assemblies 128 may then be embedded within the PCB substrate 110 such that the various conductive layer architectures couple to the one or more power devices 130 (or power devices assemblies 128) to achieve the particular topology (e.g., inverter topology, converter topology, or the like). For example, the one or more power devices assemblies 128 may include a plurality of power devices assemblies 128, which may be arranged in pairs including a first power device assembly 128a and a second power device assembly 128b. For example, in an inverter topology there may be three pairs of power devices assemblies 128. In some embodiments, pairs of power device assemblies may be arranged in a parallel topology. For example, an inverter may include one array of power device assemblies 128 including six power device assemblies thereby providing three pairs of power device assemblies. In a parallel topology, two arrays of six power device assemblies may be provided for a total of twelve power device assemblies. Similarly, there may be more than two layers of power device assemblies 128. For example, in another parallel topology, three arrays of six power device assemblies may be provided for a total of eighteen power device assemblies.

Referring now to FIG. 5A, a top view of an example top conductive layer disposed over the plurality of power device assemblies 128 is depicted. In the illustrated embodiment, the top N-layer 153 couples to each of the first power devices 130a and the top O-layers 173 connects to each of the first and second power devices 130a, 130b. For example, the top U-layer 173a couples to both a first power device 130a and the second power device 130b of a pair of power device assemblies 128, the top V-layer 173b couples to both a first power device 130a and a second power device 130b of a pair of power device assemblies 128, and the top W-layer 173c couples to both of a first power device 130a and a second power device 130b of a pair of power device assemblies 128. As will be described further in embodiments below, the P-conductive layer architecture 144 may connect to another surface of the second power device assemblies 128b. Additionally, it is noted that from this perspective each of the power terminals are depicted including the N-terminal 116, the P-terminal 118, and the one or more O-terminals 120 including the U-terminal 120a, the V-terminal 120b, and the W-terminal 120c. However, in some embodiments, the power terminals may be formed on one or more of the first surface 112 and the second surface 114 of the PCB substrate 110.

As noted above, in an inverter assembly, the N-terminal 116 may be connected to a current source (e.g., a battery) configured to output a first current type (e.g., a direct current). Accordingly, the N-terminal 116 may be electrically coupled to a positive terminal of the current source and the P-terminal 118 may be connected to a negative terminal of the current source. The one or more O-terminals 120 may be configured to output a second current type, different from the first current type, such that the first current type is converted to the second current type. For example, each pair of power devices 130 may be configured to output one of each phase of an alternating current (i.e., the U-phase, V-phase, and W-phase) to provide an alternating current to, for example, an electric motor.

Figure 5B:
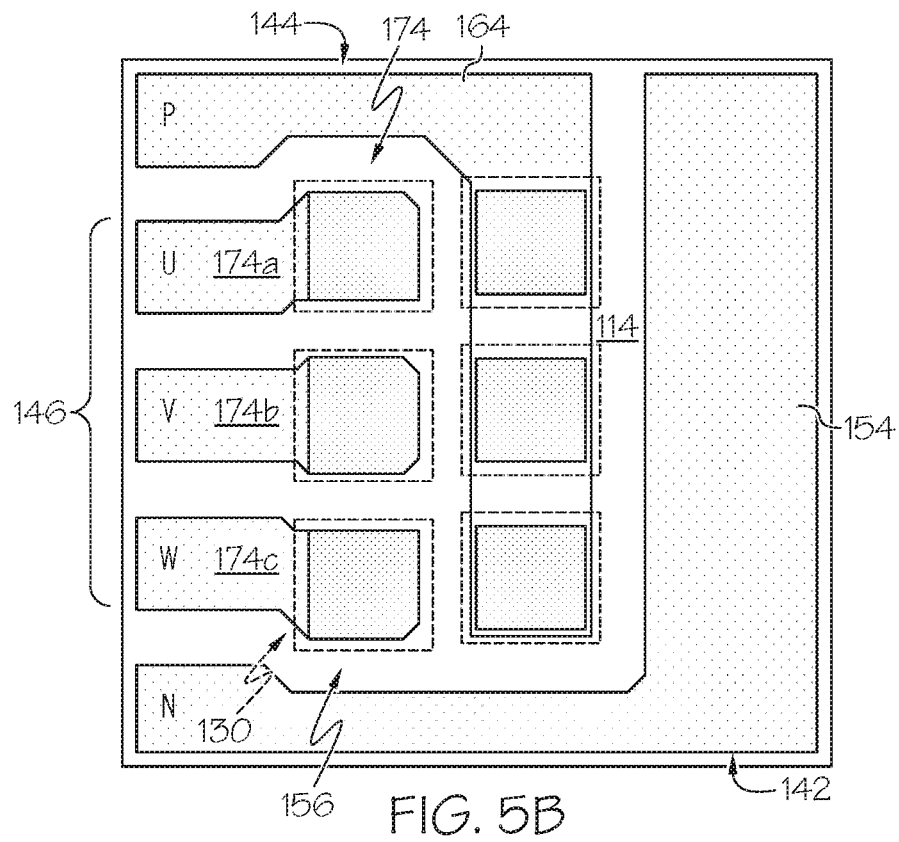
FIG. 5B schematically depicts a second or back surface of the PCB substrate of FIG. 5A, according to one or more embodiments shown and described herein.

FIG. 5B illustrates a bottom or second surface 114 of the PCB substrate 110 illustrating that each of the bottom N-layer 154, bottom O-layers 174 (including the bottom U-layer 174a, the bottom V-layer 174b, and the bottom W-layer 174c), and bottom P-layer 164, are exposed on the second surface 114, which may be attached the one or more cooling assemblies 200, described above, to allow heat transfer through the substrate via the plurality of conductive layers 140 away from the one or more power devices 130 and/or power device assemblies 128.

Figure 5C:
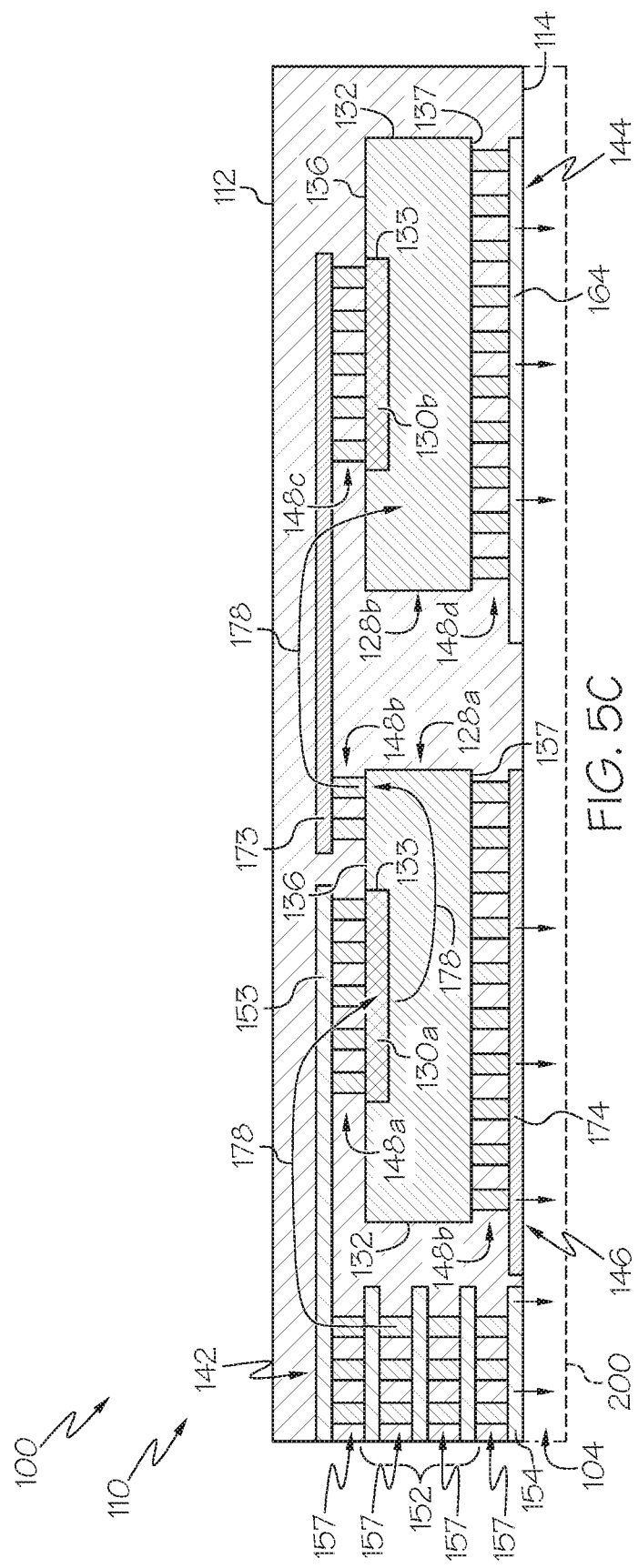
FIG. 5C schematically depicts a cross-section of the PCB substrate of FIG. 5A, according to one or more embodiments shown and described herein.

A cross-section of the present embodiment is illustrated in FIG. 5C. In the illustrated embodiment, the N-conductive layer architecture 142 is coupled to the first power device 130a or first power device assembly 128a through a first plurality of conductive vias 148a. The O-conductive layer architecture 146 is coupled to the first power device 130a and/or first power device assembly 128a through a second plurality of conductive vias 148b. For example, the a bottom O-layer 174 may be coupled to a bottom surface 137 of the conductive substrate 132 through a portion of the second plurality of conductive vias 148b and a top surface 136 of the conductive substrate 132 may be mounted to the top O-layer 173 through a second portion of the second plurality of conductive vias 148b. The P-conductive layer architecture 144 is coupled to the second power device 130b through a fourth plurality of conductive vias 148d. Accordingly, electricity (represented by arrows 178) may flow from the power source connected to the N-conductive layer architecture 142 at the N-terminal 116 through a top surface 136 of the first power device 130a through the bottom surface 137 of the conductive substrate 132 of the first power device assembly 128a, through the O-conductive layer architecture 146 to a top surface 136 of the second power device 130b, and through the P-conductive layer architecture 144 at a bottom surface 137 of the of the conductive substrate 132 of the second power device assembly 128b. As illustrated in FIG. 2, the one or more cooling assemblies 200 may be mounted to a bottom surface 137 of the PCB substrate 110 such that heat (represented via arrows 104) may also conducted through the plurality of conductive layers 140 including each of the N-conductive layer architecture 142, O-conductive layer architecture 146, and N-conductive layer architecture 142 from the one or more power devices 130 to the one or more cooling assemblies 200.

FIG. 6 depicts another variation of a driver board assembly 100 where the first power device 130a of the first power device assembly 128a is facing the second surface 114 of the PCB substrate 110, while the second power device 130b of the second power device assembly 128b is facing the first surface 112 of the PCB substrate 110. In such embodiments, the N-conductive layer architecture 142 may be arranged to direct electricity (represented by arrows 178) through the first power device 130a, which then travels through the O-conductive layer architecture 146 through the upward facing second power device 130b, and thereafter through the P-conductive layer architecture 144. As in the embodiments illustrated in FIG. 5C, heat (represented via arrows 104) may be conducted through each of the N-conductive layer architecture 142, O-conductive layer architecture 146, and P-conductive layer architecture 142 from the one or more power devices 130 to the one or more cooling assemblies 200 mounted on the second surface 114 of the PCB substrate 110.

Figure 7:
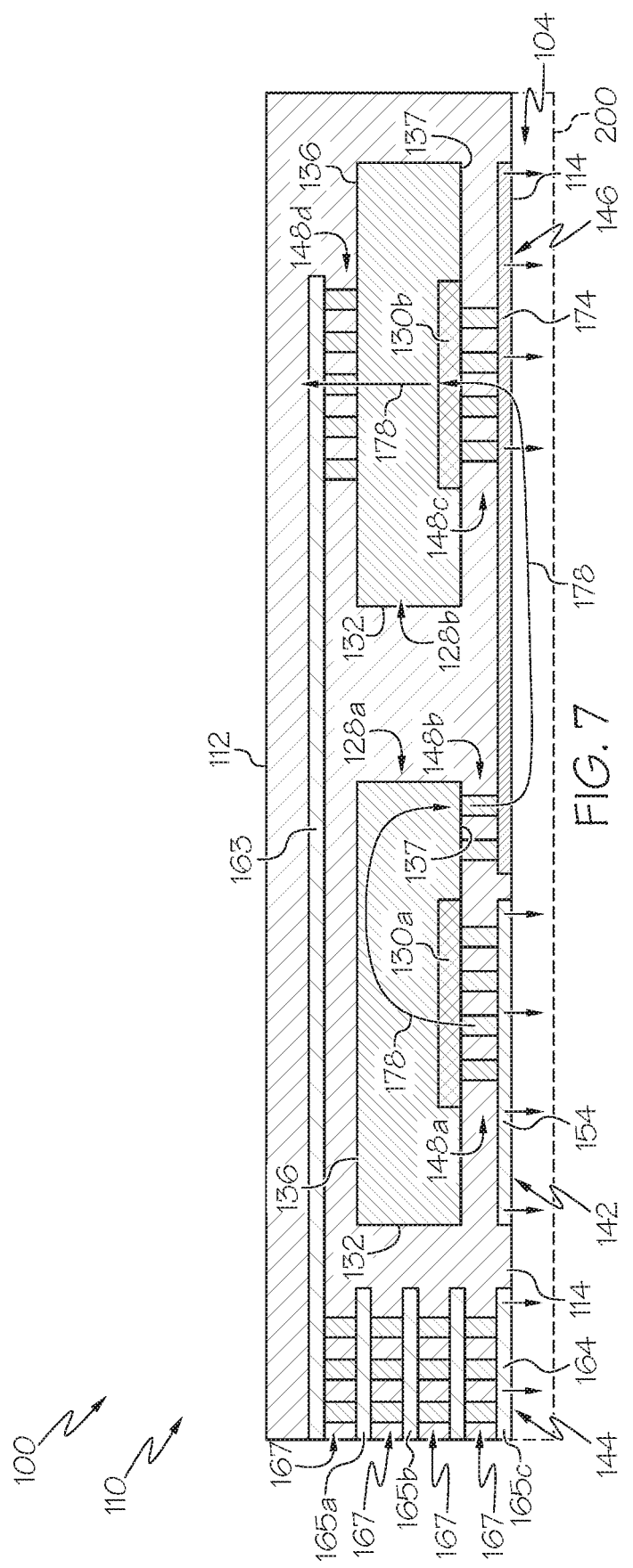
FIG. 7 schematically illustrates a cross-section of a driver board assembly having a PCB substrate wherein a first power device assembly and a second power device assembly face a bottom surface of the PCB substrate, according to one or more embodiments shown and described herein.

FIG. 7 depicts yet another variation wherein both of the power devices 130 within each power device assembly 128 may be facing toward the second surface 114 of the PCB substrate 110 instead of the first surface 112 as illustrated in FIG. 5C. In such embodiments, the N-conductive layer architecture 142 may be arranged to direct electricity (represented by arrows 178) through the first power device 130a, which then travels through the O-conductive layer architecture 146 through the conductive substrate 132 of the second power device assembly 128b, through the downward facing second power device 130b, and thereafter through the P-conductive layer architecture 144. As in the embodiments illustrated in FIG. 5C, heat (represented via arrows 104) may be conducted through each of the N-conductive layer architecture 142, O-conductive layer architecture 146, and P-conductive layer architecture 142 from the one or more power devices 130 to the one or more cooling assemblies 200 mounted on the second surface 114 of the PCB substrate 110.

Figure 8:
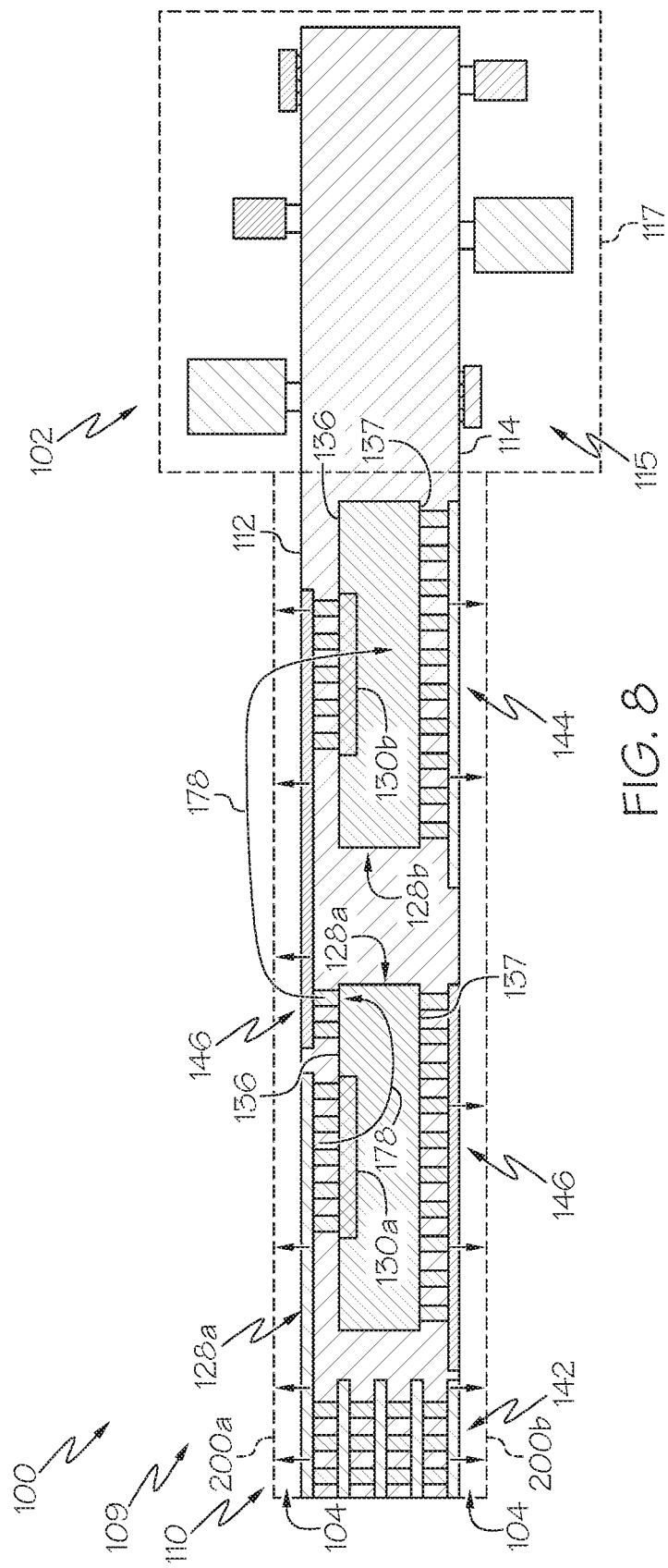
FIG. 8 schematically depicts a cross-section of a driver board assembly having a PCB board with an extended portion, according to one or more embodiments shown.

FIG. 8 depicts yet another embodiment in which the PCB substrate 110 includes a current conversion portion 109 and an extending portion 115 extending to a side of the current conversion portion 109 to mounting region 117 for mounting the plurality of passive components and/or electrical components 102. In such embodiments, the plurality of passive components and/or electrical components 102 may be mounted to the first surface 112 of the PCB substrate 110, the second surface 114 of the PCB substrate 110, or both. By providing a separate mounting region 117 for the plurality of passives and/or electrical components 102, a first cooling assembly 200a may be mounted to the first surface 112 and a second cooling assembly 200b may be mounted to the second surface 114 of the PCB to provide double sided cooling to the one or more power devices 130, which may improve cooling. For example, the N-conductive layer architecture 142, O-conductive layer architecture 146, and/or P-conductive layer architecture 144 may conduct heat to the first cooling assembly 200a and/or the second cooling assembly 200b.

Figure 9:
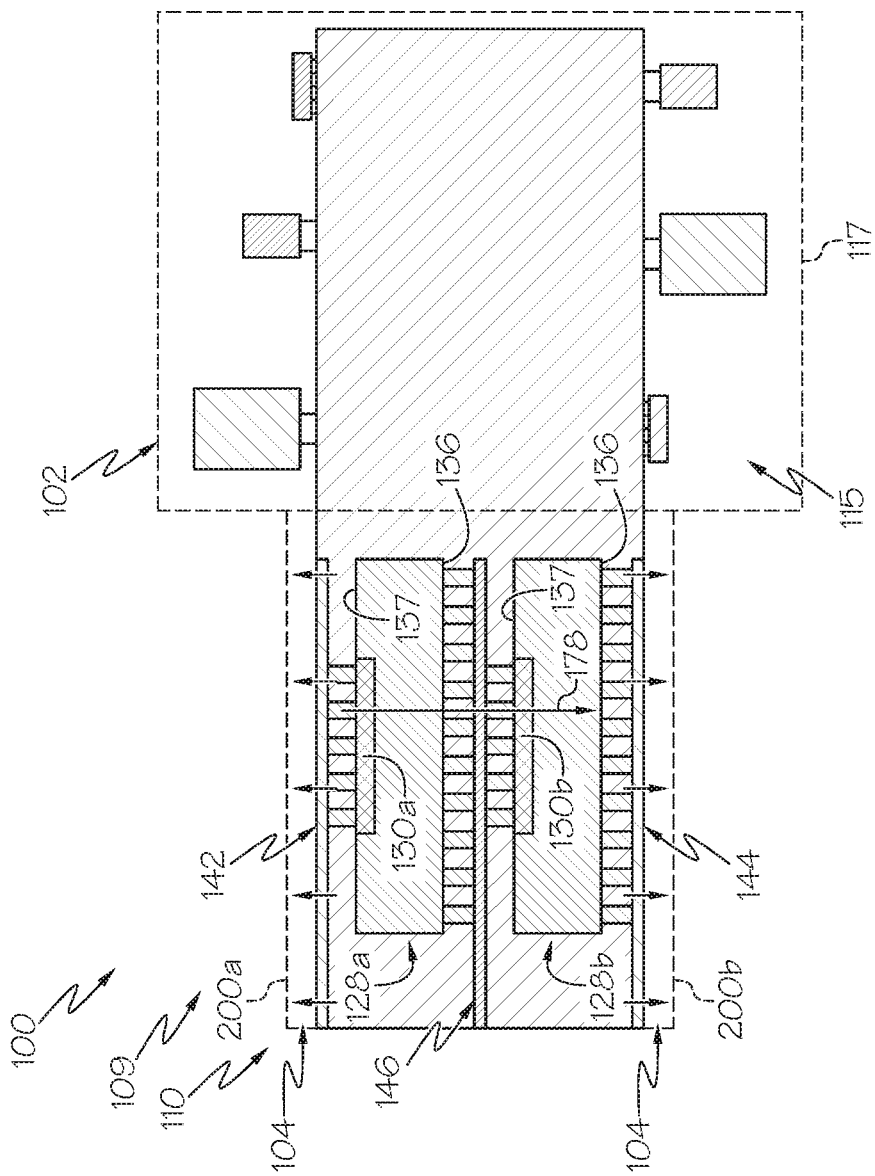
FIG. 9 schematically depicts a cross-section of a driver board assembly where a first power device assembly is positioned in a stacked relationship with a second power device assembly, according to one or more embodiments shown.

FIG. 9 illustrates yet another embodiment configured for double-sided cooling is depicted. In this embodiment and similar to the embodiment of FIG. 8, the PCB substrate 110 includes a current conversion portion 109 and an extending portion 115 extending to a side of the current conversion portion 109 to provide a mounting region 117 for mounting the plurality of passives and other electrical components 102. In such embodiments, the plurality of passives and other electrical components 102 may be mounted to the first surface 112 of the PCB substrate 110, the second surface 114 of the PCB substrate 110, or both. By providing a separate mounting region 117 for the plurality of passive components and/or electrical components 102, a first cooling assembly 200a may be mounted to the first surface 112 and a second cooling assembly 200b may be mounted to the second surface 114 of the PCB to provide double sided cooling to the one or more power devices 130, which may improve cooling. However, in this embodiment, each of the first power device assembly 128a is stacked on top of the second power device assembly 128b. In such embodiments, a layer of the O-conductive layer architecture 146 may be sandwiched between the first power device assembly 128a and the second power device assembly 128b via the second and third plurality of conductive vias 148b, 148c. Accordingly the primary cooling architecture may be provided via the N-conductive layer architecture 142 to the first cooling assembly 200a and the P-conductive layer architecture 144 to the second cooling assembly 200b, though other configurations are contemplated and possible. Such stacked arrangement may provide for lower inductance so as to lower switching loss at high switching frequencies. In this embodiment, the footprint of the driver board assembly 100 may be similar to that such as illustrated in FIG. 1.

Figure 10:
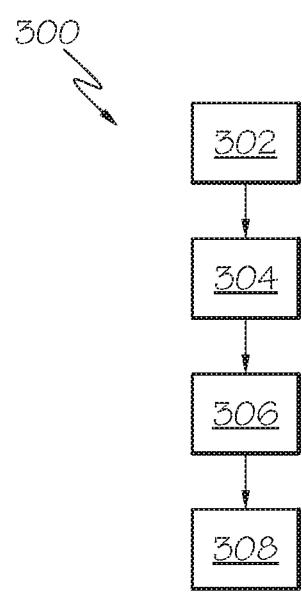
FIG. 10 illustrates a flow chart depicting a method of assembling a driver board assembly, according to one or more embodiments shown and described herein.

Referring now to FIG. 10, a flowchart depicting a method 300 for assembling a driver board assembly 100 according to one or more embodiments described herein, is depicted. It is noted that a greater or fewer number of steps in any order may be included without departing from the scope of the present disclosure. In particular, at step 302, the one or more power devices 130 may be arranged within the PCB substrate 110. For example, and as described above, the one or more power devices 130 may include a plurality of power devices arranged in pairs of two comprising the first power device 130a and the second power device 130b. For example, and as noted above, an inverter topology may include three pairs of power devices 130. In embodiments, arranging the one or more power devices 130 within the PCB substrate 110 may include mounting each of the power devices 130 in a power device assembly 128, each including a conductive substrate 132. The one or more power device assemblies 128 may be embedded (e.g., laminated) within the PCB substrate 110 as described above.

The method 300 at step 304 includes arranging a plurality of conductive layers 140 within the PCB substrate 110. For example, and as noted above, the plurality of conductive substrates may be arranged in a variety of ways such that the N-conductive layer architecture 142 is coupled to the first power device 130a, the O-conductive layer architecture 146 couples the first power device 130a to the second power device 130b; and the P-conductive layer architecture 144 is coupled to the second power device 130b. For example, in an inverter topology the N-conductive layer architecture 142 may provide direct current to the first power device 130a. The O-conductive layer architecture 146 may electrically couple to first power device 130a and the second power device 130b and switching of the first power device 130a and the second power device 130b may allow the O-conductive layer architecture 146 to output an alternating current such as described above, to for example, a motor. The P-conductive layer architecture 144 may complete the electrical circuit by coupling the second power device 130b to back to the current source.

At step 306, the method 300 further includes coupling one or more cooling assemblies 200 to at least one of the first surface 112 of the PCB substrate 110 and the second surface 114 of the PCB substrate 110 opposite the first surface 112 of the PCB substrate 110. For example, the one or more cooling assemblies 200 may be mounted to the PCB substrate 110 via for example, a plurality of fasteners 212. In some embodiments, a first cooling assembly 200a may be mounted to the first surface 112 of the PCB substrate 110 and a second cooling assembly 200b may be mounted to the second surface 114 of the PCB substrate 110. At step 308, the method 300 may further include, at step 308, mounting one or more additional heat generating device (e.g., a capacitor 210 as illustrated in FIG. 2 to the one or more cooling assemblies 200 opposite the PCB substrate 110. The heat generating device may be mounted with a plurality of fasteners 212 as described herein and with reference to FIG. 2, or some other conventional fastening method 300.

It should now be understood that embodiments of the present disclosure are directed to driver board assemblies and method 300 of assembling a driver board. In the embodiments described herein driver board assemblies include a PCB substrate. The PCB substrate may include one or more embedded power devices and a plurality of conductive layers that together may create one of an inverter topology and a converter topology. The plurality of conductive layers also provide thermal paths for directing heat to one or more cooling assemblies, which may be mounted to the PCB substrate. By integrating the one or more power devices into a body of the PCB substrate, a more compact, power dense driver board may be achieved. Embodiments as provided herein provide numerous advantages including smaller volume profiles, lighter system weights, high system power density, lower overall inductance (e.g., so that smaller switching loss is achieved, especially at high switching frequencies), lower cost, or the like. Moreover, embodiments of the present disclosure are able to operate under high power (e.g., 40+KW) environments, thereby providing greater range of uses.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A driver board assembly comprising;
   a printed circuit board (PCB) substrate;
   one or more power devices embedded within the PCB substrate, wherein the one or more power devices are high power devices operable at about 40 KW or more; and
   a plurality of conductive layers arranged within the PCB substrate, the plurality of conductive layers configured to electrically couple the one or more power devices to a current source and thermally couple the one or more power devices to one or more cooling assemblies mounted to at least one of a first surface of the PCB substrate and a second surface of the PCB substrate opposite the first surface of the PCB substrate.

2. The driver board assembly of claim 1, wherein the one or more cooling assemblies comprise:
   an electrical insulation layer mounted to the at least one of the first surface of the PCB substrate and the second surface;
   a cold plate mounted to the electrical insulation layer opposite the PCB substrate, wherein the electrical insulation layer thermally couples the cold plate to the plurality of conductive layers.

3. The driver board assembly of claim 2, wherein the one or more cooling assemblies further comprise a heat spreader layer positioned between the electrical insulation layer and the cold plate, wherein the heat spreader layer thermally couples the cold plate to the electrical insulation layer.

4. The driver board assembly of claim 2, further comprising a capacitor mounted to the cold plate opposite the electrical insulation layer.

5. The driver board assembly of claim 1, further comprising:
   a first cooling assembly mounted to the first surface of the PCB substrate; and
   a second cooling assembly mounted to the second surface of the PCB substrate.

6. The driver board assembly of claim 1, wherein:
   the one or more power devices comprises a plurality of power devices embedded within the PCB substrate in pairs of two comprising a first power device and a second power device; and
   the plurality of conductive layers are arranged within one of an inverter topology and a converter topology, the plurality of conductive layers comprising:
      an N-conductive layer architecture coupled to the first power device through a first plurality of conductive vias, the N-conductive layer architecture defining an N-terminal configured to be connected to the current source capable of outputting one of a direct current or an alternating current;
      an O-conductive layer architecture coupled to the first power device through a second plurality of conductive vias and the second power device through a third plurality of conductive vias thereby providing electrical communication between the first power device and the second power device, the O-conductive layer architecture defining one or more O-terminals configured to output one of a direct current and an alternating current opposite the current source; and a P-conductive layer architecture coupled to the second power device through a fourth plurality of conductive vias, the P-conductive layer architecture defining a P-terminal operable to be connected to the current source, such that electrical current flows to the current source, wherein each of the N-conductive layer architecture, the O-conductive layer architecture, and the P-conductive layer architecture thermally couple the first power device and the second power device to the one or more cooling assemblies mounted to at least one of the first surface of the PCB substrate and the second surface of the PCB substrate opposite the first surface of the PCB substrate.

7. The driver board assembly of claim 6, wherein the first power device and the second power device arranged in a stacked relationship.

8. A driver board assembly comprising;
a PCB substrate;
one or more power device assemblies comprising:
 a conductive substrate; and
 a power device embedded within the conductive substrate, wherein the one or more power device assemblies are embedded within the PCB substrate, the power device is a high power devices operable at about 40 KW or more; and
a plurality of conductive layers arranged within the PCB substrate configured to electrically couple the one or more power device assemblies to a current source and thermally couple the one or more power device assemblies to one or more cooling assemblies mounted to at least one of a first surface of the PCB substrate and a second surface of the PCB substrate opposite the first surface of the PCB substrate.

9. The driver board assembly of claim 8, wherein the one or more cooling assemblies comprise:
an electrical insulation layer mounted to the at least one of the first surface of the PCB substrate and the second surface; and
a cold plate mounted to the electrical insulation layer opposite the PCB substrate, wherein the electrical insulation layer thermally couples the cold plate to the plurality of conductive layers.

10. The driver board assembly of claim 9, wherein the one or more cooling assemblies further comprise a heat spreader layer positioned between the electrical insulation layer and the cold plate, wherein the heat spreader layer thermally couples the cold plate to the electrical insulation layer.

11. The driver board assembly of claim 9, further comprising a capacitor mounted to the cold plate opposite the electrical insulation layer.

12. The driver board assembly of claim 8, further comprising:
a first cooling assembly mounted to the first surface of the PCB substrate; and
a second cooling assembly mounted to the second surface of the PCB substrate.

13. The driver board assembly of claim 8, wherein:
the one or more power device assemblies comprise a first power device assembly and a second power device assembly embedded within the PCB substrate; and
the plurality of conductive layers are arranged within one of an inverter topology and a converter topology, the plurality of conductive layers comprising:
 an N-conductive layer architecture coupled to the first power device assembly through a first plurality of conductive vias, the N-conductive layer architecture defining an N-terminal configured to be connected to the current source capable of outputting one of a direct current or an alternating current;
 an O-conductive layer architecture coupled to the first power device assembly through a second plurality of conductive vias and the second power device assembly through a third plurality of conductive vias thereby providing electrical communication between the first power device assembly and the second power device assembly, the O-conductive layer architecture defining one or more O-terminals configured to output one of a direct current and an alternating current opposite the current source; and
 a P-conductive layer architecture coupled to the second power device assembly through a fourth plurality of conductive vias, the P-conductive layer architecture defining a P-terminal operable to be connected to the current source, such that electrical current flows to the current source,
wherein each of the N-conductive layer architecture, the O-conductive layer architecture, and the P-conductive layer architecture thermally couple the first power device assembly and the second power device assembly to the one or more cooling assemblies mounted to at least one of the first surface of the PCB substrate and the second surface of the PCB substrate opposite the first surface of the PCB substrate.

14. The driver board assembly of claim 13, wherein each of the N-conductive layer architecture, the O-conductive layer architecture, and the P-conductive layer architecture comprise a plurality of layers electrically and thermally coupled to one another via a plurality of conductive vias.

15. The driver board assembly of claim 13, wherein the first power device assembly and the second power device assembly arranged in a stacked relationship.

16. The driver board assembly of claim 1, wherein each of the conductive layers along the one or more conductive pathways are electrically and thermally coupled to one another through a plurality of conductive vias to electrically couple the one or more power devices to the current source and thermally couple the one or more power devices to the one or more cooling assemblies.

17. A method of forming a driver board assembly, the method comprising:
arranging one or more power devices within a PCB substrate, wherein the one or more power devices are high power devices operable at about 40 KW or more; and
arranging a plurality of conductive layers within the PCB substrate, the plurality of conductive layers configured to electrically couple the one or more power devices to a current source and thermally couple the one or more power devices to one or more cooling assemblies mounted to at least one of a first surface of the PCB substrate and a second surface of the PCB substrate opposite the first surface of the PCB substrate.

18. The method claim 17, wherein the one or more cooling assemblies comprise:
an electrical insulation layer mounted to the at least one of the first surface of the PCB substrate and the second surface;

a cold plate mounted to the electrical insulation layer opposite the PCB substrate, wherein the electrical insulation layer thermally couples the cold plate to the plurality of conductive layers.

19. The method of claim 18, wherein the one or more cooling assemblies further comprise a heat spreader layer positioned between the electrical insulation layer and the cold plate, wherein the heat spreader layer thermally couples the cold plate to the electrical insulation layer.

20. The method of claim 18, further comprising mounting a capacitor to the cold plate opposite the electrical insulation layer.

\* \* \* \* \*